United States Patent [19]

Mitsui et al.

[11] Patent Number: 5,045,500
[45] Date of Patent: Sep. 3, 1991

[54] METHOD OF MAKING A SEMICONDUCTOR LASER

[75] Inventors: Shigeru Mitsui; Ryo Hattori; Tetsuya Yagi, all of Itami, Japan

[73] Assignee: Mitsubishi Denki Kabushiki Kaisha, Japan

[21] Appl. No.: 557,073

[22] Filed: Jul. 25, 1990

Related U.S. Application Data

[62] Division of Ser. No. 382,220, Jul. 20, 1989, Pat. No. 4,964,135.

[30] Foreign Application Priority Data

Jul. 22, 1988 [JP] Japan .................................. 63-184248
Jul. 7, 1989 [JP] Japan .................................. 1-176877

[51] Int. Cl.$^5$ ............................................ H01L 21/20
[52] U.S. Cl. ............................ 437/129; 148/DIG. 95; 437/133
[58] Field of Search ................ 148/DIG. 26, 50, 51, 148/56, 65, 72, 95, 119, 135, 169, 110, 33, 33.1, 33.2, 33.5; 357/16, 17, 56; 372/43, 44, 45, 46, 48; 437/81, 89, 90, 105, 107, 108, 110, 111, 126, 127, 129, 133, 936, 947, 974

[56] References Cited

U.S. PATENT DOCUMENTS

| | | | |
|---|---|---|---|
| 4,758,535 | 7/1988 | Sakakibara et al. | 437/129 |
| 4,849,372 | 7/1980 | Takemoto | 437/129 |

FOREIGN PATENT DOCUMENTS

| | | | |
|---|---|---|---|
| 0166587 | 7/1982 | Japan | 372/46 |
| 0155981 | 9/1984 | Japan | 437/129 |
| 0220985 | 12/1984 | Japan | 437/129 |
| 0074382 | 4/1986 | Japan | 372/46 |
| 61-160990 | 7/1986 | Japan . | |
| 61-174685 | 8/1986 | Japan . | |
| 0005678 | 1/1987 | Japan | 437/129 |
| 62-25485 | 2/1987 | Japan . | |
| 62-51281 | 3/1987 | Japan . | |
| 62-65391 | 3/1987 | Japan . | |
| 62-179190 | 8/1987 | Japan . | |
| 63-10583 | 1/1988 | Japan . | |
| 63-34992 | 2/1988 | Japan . | |

OTHER PUBLICATIONS

Nakatsuka et al, "A New Self-Aligned . . . by MOCVD", Japanese Journal of Applied Physics, vol. 25, No. 6, Jun. 1986, pp. 498-500.

Yang et al, "High Power Operation . . . (ICSP) Lasers", Electronics Letters, vol. 21, No. 17, Aug. 15, 1986, pp. 751-752.

Mawst et al, "Complementary Self-Aligned . . . Vapour Deposition", Electronics Letters, vol. 21, No. 20, Sep. 26, 1985, pp. 903-905.

*Primary Examiner*—Olik Chaudhuri
*Assistant Examiner*—William Bunch
*Attorney, Agent, or Firm*—Leydig, Voit & Mayer

[57] ABSTRACT

A semiconductor laser includes a first cladding layer having a forward mesa with at least one end at least partially spaced from the adjacent facet of the laser. A current blocking layer buries the mesa at its sides and at least partially at the ends of the mesa so that the ends are at least partially spaced from the facets. The current blocking layer reduces current injection and surface recombination at the facets at least partially spaced from the mesa ends, thereby increasing the catastrophic optical damage level of the laser. The mesa is formed without etching or exposing the active layer so that formation of interfaces that refract light or shorten laser lifetime are avoided. An increase in COD level of about 20 percent is achieved in the invention.

9 Claims, 7 Drawing Sheets

METHOD OF MAKING A SEMICONDUCTOR LASER

This application is a division of application Ser. No. 07/382,220, filed July 20, 1989 U.S. Pat. No. 4,964,135.

FIELD OF THE INVENTION

The present invention relates to a semiconductor laser and particularly to a semiconductor laser of the type used in an optical memory system, in a communication system, and in other applications.

BACKGROUND OF THE INVENTION

FIG. 8 shows the structure of a known buried ridge-type self-aligned semiconductor laser. The semiconductor laser includes an n-type gallium arsenide (GaAs) semiconductor substrate 1 which has layers of aluminum gallium arsenide (AlGaAs) disposed on it to form the laser structure. An n-type $Al_{0.5}Ga_{0.5}As$ first cladding layer 2, a p-type $Al_{0.15}Ga_{0.85}As$ active layer 3, and a p-type $Al_{0.5}Ga_{0.5}As$ second cladding layer 4 having a so-called forward mesa-shaped stripe ridge 4a are successively disposed on the substrate 1. The layers 2, 3, and 4 are grown, preferably by a metal organic chemical vapor deposition (MOCVD) process. An n-type GaAs current blocking layer 5 is disposed on the second cladding layer 4. A p-type GaAs contact layer 6 is disposed on the current blocking layer 5. Electrodes 7 and 8 are disposed on the substrate 1 and the contact layer 6, respectively. Laser oscillation takes place in the structure in a region 9 indicated in FIG. 8 by the broken line.

When a positive voltage is applied to electrode 8 relative to electrode 7 and a current is injected into the active layer 3 through the stripe ridge 4a of the second cladding layer 4, recombination of injected electrons and holes occurs in the active layer 3, generating light. When the bias voltage is raised to increase the injected current, the induced radiative component in the active region 3 is increased. When the light amplification gain due to the induced radiative component exceeds a threshold value determined by losses in the light waveguide of the laser structure, coherent light is radiated from the laser oscillation region 9.

FIG. 9(a) shows the relationship between the magnitude of the injected current and the magnitude of the light output of the laser of FIG. 8. At point A on the graph of FIG. 9(a), so-called catastrophic optical damage (COD) occurs. At that point, the facet of the laser through which light is radiated is damaged and may even be melted in localized areas. In order to increase the intensity of light at which COD occurs (the COD level), it is conventional to make active layer 3 relatively thin. Another known measure that increases the COD level is asymmetrical coating of the laser facets. The asymmetrical coating reduces the reflectance of the facet of the laser from which light is radiated and increases the reflectance of the opposite facet. The different reflectances are achieved by applying different coatings to the opposite laser facets.

These known steps for increasing the COD level both have disadvantages. In FIG. 10, the variation of threshold current with active layer thickness is plotted. When the active layer is made thinner, the threshold current for producing laser oscillation rapidly increases once a particular thickness, indicated as point B in FIG. 10, is reached. That thickness is about 0.05 micron, although some variation in the active layer thickness at which threshold current is mimimized is observed depending upon the laser structure. Because of the change in threshold current with the thickness of the active layer, the maximum improvement in COD level achieved by reducing the active layer thickness is limited in practice. The reduced reflectance of the front facet when asymmetrical reflectance coatings are applied results in undesirable optical feedback from external light sources and increases noise therefrom. As a result, the light output from the laser is excessively influenced by slight variations in the magnitude of the injection current.

FIG. 11 is a longitudinal cross-sectional view of another known semiconductor laser structure intended to increase the COD level. In that structure, light absorption in the neighborhood of the facet is reduced to raise the COD level. In FIG. 11, an $n^+$-type GaAs substrate 21 has disposed on it the layers forming the laser structure. An n-type $Al_{0.35}Ga_{0.65}As$ first cladding layer 22, an $Al_{0.05}Ga_{0.95}As$ active layer 23, and a p-type $Al_{0.35}Ga_{0.65}As$ second cladding layer 24 are disposed on the substrate 21. Layers 22, 23, and 24 are successively grown by liquid phase epitaxy (LPE). A p-type GaAs current blocking layer 25 is disposed on a portion of the $n^+$-type GaAs substrate 21 at each of the facets of the laser. An n-type current blocking layer 26 is disposed on the p-type GaAs current blocking layer 25 adjacent layers 23, 24, and 25 at the facets of the laser. A p-type GaAs contact layer 27 formed by diffusing zinc into the GaAs is disposed on the p-type second cladding layer 24. A silicon dioxide ($SiO_2$) insulating film 28 is disposed on n-type current blocking layer 26 opposite the substrate 21 and at the facets. Electrodes 29 and 30 are disposed on substrate 21 and on the contact layer 27 and the insulating film 28, respectively.

The laser of FIG. 11 is produced in two separate LPE growth steps. In the first step, the first cladding layer 22, the active layer 23, and the second cladding layer 24 are successively grown on the $n^+$-type GaAs substrate 21. Thereafter, a photoresist stripe is disposed on the second cladding layer 24, leaving the ends, i.e., the facets, exposed. The exposed parts of the structure are etched until the substrate 21 is exposed at the facets of the laser. The p-type current blocking layer 25 and the n-type current blocking layer 26 are grown on the partially completed device in the second LPE growth step. The $SiO_2$ insulating film 28 is deposited on the n-type current blocking layer 26 and the contact region 27 is produced by diffusing zinc into the cladding layer 24 using the insulating film 28 as a mask. Finally, the electrodes 29 and 30 are deposited, thereby completing the device shown in FIG. 11.

In the laser device of FIG. 11, the current blocking layers 26 have a much larger energy band gap than that of the active layer 23. As a result, little coherent light generated at the active layer is absorbed in the current blocking layers at the facets, reducing the temperature rise for a particular current level, thereby increasing the COD level. This structure approaches a perfect, i.e., non-absorbing, mirror at the facets.

However, the laser of FIG. 11 has a number of disadvantages. The cost of producing the laser is too high to make it commercially practical. The active layer has, in the neighborhood of the facet, a regrowth interface that is exposed to air during the two step, i.e., two growth, production process. That exposure permits the formation of an oxide layer that results in rapid deterioration of the active layer at the facet and reduced laser lifetime. Furthermore, the surfaces of the active layer that are etched during the processing steps in manufacturing the laser device cause light refraction because of the creation of interfacial layers. As a result, the far-field pattern of the emitted light is greatly distorted.

Other theoretical phenomena that could increase the COD level are known but have not been successfully employed in practice. For example, current injection and surface recombination of charge carriers at the facet surfaces may be limited or eliminated. Current injection and surface recombination are accompanied by phonon emission, raising the temperature of the laser near the facets. By avoiding or reducing current injection and, thereby, phonon emission, the facet temperature for a particular current level is decreased, effectively increasing the COD level. However, like the structure of FIG. 11, structures exploiting these theoretical solutions have not previously been economically or practically successful.

SUMMARY OF THE INVENTION

It is an object of the present invention to provide a semiconductor laser having a COD level that, for a particular active layer thickness and facet reflectance, is increased over the COD levels of the prior art.

It is a further object of the invention to provide a semiconductor laser having an increased COD level that may be economically and practically manufactured.

Still another object of the present invention is to provide a semiconductor laser structure that results in reduced current injection and surface recombination of charge carriers at the facet surfaces, thereby increasing the COD level of the laser.

Other objects and advantages of the present invention will become apparent from the detailed description given hereinafter. It is should be understood, however, that the detailed description and specific embodiments are given by way of illustration only, since various changes and modifications within the spirit and scope of the invention will become apparent to those skilled in the art from the detailed description of preferred embodiment.

A semiconductor laser in accordance with the invention includes a cladding layer having a forward mesa that is at least partially separated at one of its ends from at least one of the facets of the laser. The mesa is buried at its sides and at least partially at its ends by a current blocking layer. The current blocking layer reduces current injection and surface recombination at the facets, thereby increasing the COD level.

A laser according to the invention is made by successively depositing a first cladding layer, an active layer, and a second cladding layer on a substrate. The second cladding layer is selectively etched to form a forward mesa having ends at least partially separated from the location where facets of the laser will be formed. The etching is insufficient to expose the active layer. A current blocking layer is deposited to bury the mesa at its sides and at least partially at its ends but not at its top. A contacting layer is deposited on the top of the mesa and the current blocking layer. Electrodes are deposited on the contacting layer and substrate and facets are formed to complete the laser.

BRIEF DESCRIPTION OF THE DRAWING

In all figures, like elements are given the same reference numbers.

DETAILED DESCRIPTION OF PREFERRED EMBODIMENTS

Figures 1A, 1B:
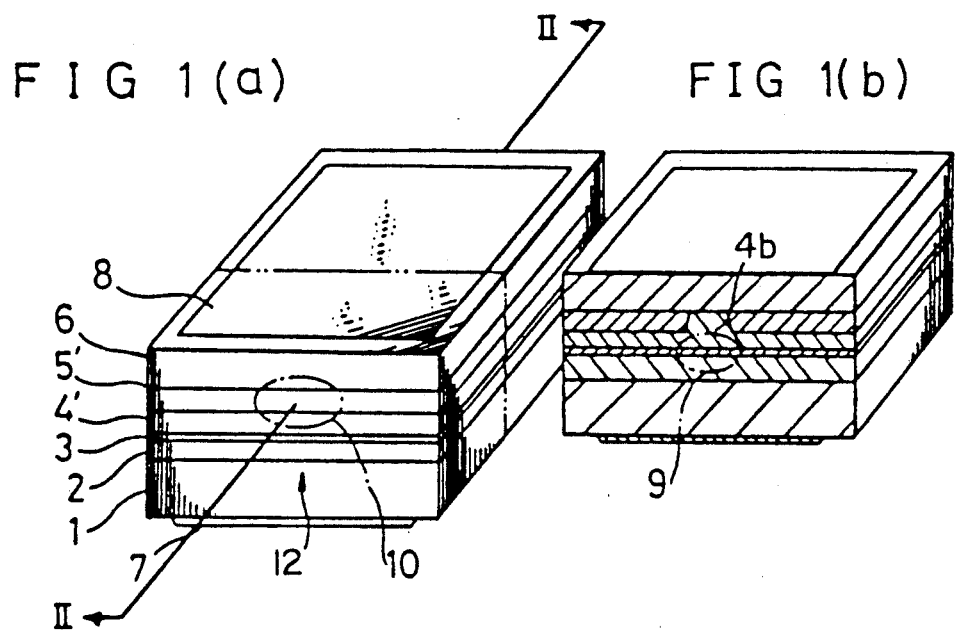
FIGS. 1(a) and 1(b) are a perspective view and a transverse sectional view, respectively, of the structure of a semiconductor laser according to an embodiment of the invention.
Figure 2:
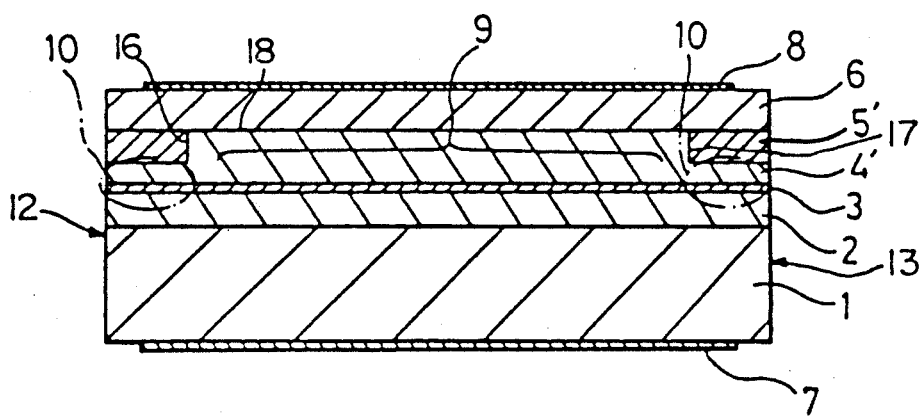
FIG. 2 is a longitudinal cross-sectional view of the semiconductor laser of FIG. 1 taken along line II—II of FIG. 1(a).

FIG. 1(a) shows the external structure of a semiconductor laser according to an embodiment of the present invention, particularly at the facet of the laser. FIG. 1(b) shows a transverse cross-sectional view of the laser structure of FIG. 1(b) taken along the indicated broken line of FIG. 1(a). FIG. 2 shows a longitudinal cross-sectional view of the structure of FIG. 1(a) taken along line II—II of FIG. 1(a).

The laser structure of FIGS. 1(a), 1(b), and 2 includes an n-type semiconductor substrate 1 on which are successively disposed an n-type $Al_{0.5}Ga_{0.5}As$ cladding layer 2, a p-type $Al_{0.15}Ga_{0.85}As$ active layer 3, and a p-type $Al_{0.5}Ga_{0.5}As$ second cladding layer 4'. An n-type GaAs current blocking layer 5' is disposed on the second cladding layer 4' except for the central ridge portion thereof. Layer 4' is not a generally planar layer as are layers 2 and 3. Rather, layer 4' is formed in a forward mesa structure 4b that is modified in thickness near the facets 12 and 13 of the laser. As indicated in FIG. 2, the layer 4' is relatively thin near the facets but has a greater thickness, i.e., the full thickness of the forward mesa, in the central portion of the structure. Outside the forward mesa, the second cladding layer is of a substantially uniform thickness. At each point of the structure, the total of the thicknesses of layers 4' and 5' is substantially the same.

A p-type GaAs contact layer 6 is disposed on the ridge portion of the second cladding layer 4' and on current blocking layer 5'. Electrodes 7 and 8 are disposed on the substrate 1 and the contact layer 6, respectively.

Laser oscillation takes place in the structure of FIGS. 1(a), 1(b), and 2 in the region 9, best viewed in FIG. 2. At the regions 10 near the facets 12 and 13, pn junctions are formed between layers 4' and 5' that discourage or prevent current injection and surface recombination at the laser facets when the laser is biased to produce coherent light oscillations.

Figure 3A:
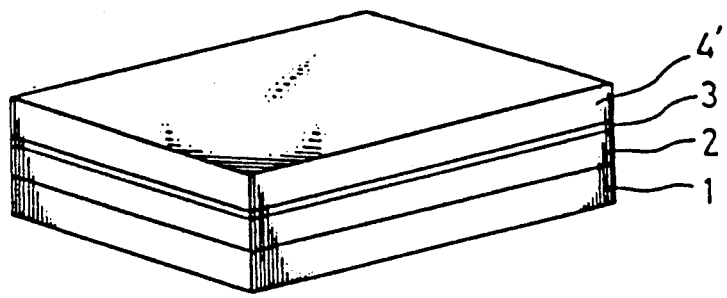
FIGS. 3(a), 3(b), and 3(c) are diagrams illustrating a process for producing the semiconductor laser of FIG. 1(a).
Figure 3B:
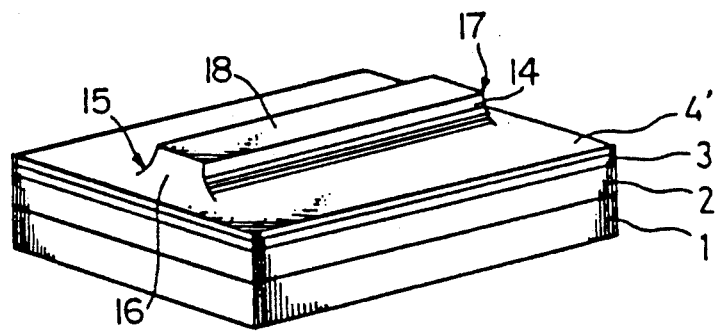
Figure 3C:
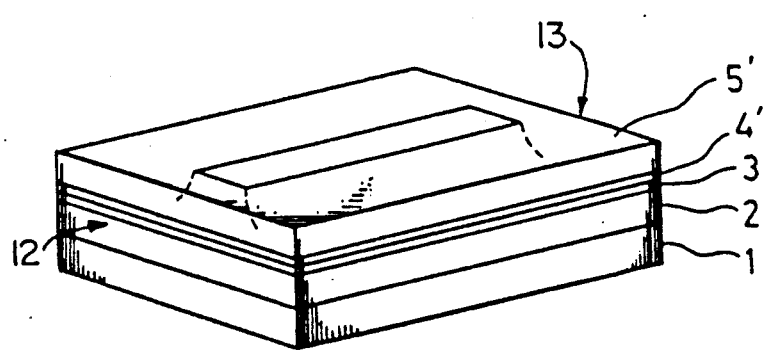

FIG. 3(a)-3(c) illustrate a method of manufacturing the embodiment of the invention shown in FIGS. 1(a), 1 (b), and 2. First cladding layer 2, active layer 3, and second cladding layer 4' are successively grown, without interruption of the ongoing growth process, on the substrate 1 as illustrated in FIG. 3(a). These three layers may be grown by a CVD provess such as MOCVD.

As illustrated in FIG. 3(b), portions of the layer 4' are removed by etching. As is conventional in the art, the mesa is defined using a mask that is not attacked by the etchant used to remove a portion of the second cladding layer 4'. For example, the mask may be $SiO_2$ that is formed into the desired mask pattern using conventional photolithography techniques. Portions of the layer 4' are left in place to form the forward mesa 4b at the central portion of the structure. Mesa 4b includes lateral sides 14 and 15 that extend longitudinally, i.e., in the direction between facets 12 and 13, and ends 16 and 17 that are transverse, i.e., generally parallel to and spaced from facets 12 and 13. At least one of the ends 16 and 17 is spaced from the respective adjacent facet 12 and 13 and preferably both of the ends are spaced from the respective facets. The extent of the etching to form mesa 4b is insufficient to remove all of layer 4' at any point so that active layer 3 is not exposed to the etchant or the ambient during the processing illustrated in FIG. 3(b).

As indicated in FIG. 3(c), n-type current blocking layer 5' is deposited on the second cladding layer 4', for example by an MOCVD process, except on the top surface 18 of the forward mesa 4b. Current blocking layer 5' buries the mesa, as shown in FIG. 3(c), and isolates the ends of the mesa from the facets that are spaced from the ends. In other words, the mesa is buried not only at its longitudinal sides but also adjacent at least one of its ends as illustrated in FIG. 2. The current blocking layer 5' forms a rectifying junction with the layer 4', reducing the current injection and carrier recombination at the facets 12 and 13 compared to other laser structures.

The contact layer 6 is deposited on the current blocking layer 5. Then facets 12 and 13 are formed so that the desired structure is produced. The preferred method of forming the facets 12 and 13 is cleaving, although severing and polishing steps can also be employed. Thus, when the described steps illustrated in FIGS. 3(a), 3(b), and 3(c) are carried out, the laser facets usually have not yet been formed. Therefore, the etching step illustrated in FIG. 3(b) is carried out so that at least one of the ends of the mesa will be spaced from a laser facet when the facet is formed. FIGS. 3(a), 3(b), and 3(c) illustrate the production of a single laser. If a plurality of lasers according to the invention are formed simultaneously from a single semiconductor wafer, each forward mesa consists of an isolated stripe on the wafer. Isolated stripes lying along a straight line on the wafer are separated by regions in which the stripe, but not the corresponding layer 4', is discontinuous. Facets are formed at those discontinuities. The discontinuities are buried along with the mesa when current blocking layer 5' is deposited. After formation of the facets, electrodes 8 and 9 are formed on the substrate 1 and the contact layer 6, respectively, to complete the device of FIG. 1(a).

When a current exceeding the lasing threshold flows through the structure of FIG. 1(a), minority carriers are injected into the active layer 3 at the laser oscillation region 9 in a density of about $2 \times 10^{18} cm^{-3}$. A carrier population inversion must occur to support the laser oscillation. About 90 percent of the injected carriers are converted into photons. Carriers are excited in and into the population inversion through current injection and optical absorption. Although minority carriers are also created by the absorption of light from the laser, the density of optically excited carriers is less than one-tenth of the injected carrier concentration because the quantity of injected minority carriers near the facets is relatively small. That quantity is kept small by the presence of blocking layer 5' which forms a rectifying junction with the layer 4, discouraging current injection at the facets. As a result of the reduced current injection levels, surface recombination of electron-hole pairs at the facet or facets from which the end or ends of the forward mesa is separated is reduced compared to a laser structure having a forward mesa with ends extending all of the way to the facet or facets. In addition, the reduced charge carrier density at the facet reduces heat from optical absorption and recombination processes that are accompanied by phonon emissions.

Figure 9A:
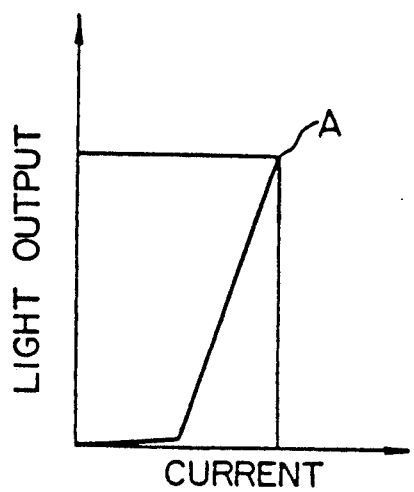
FIGS. 9(a) and 9(b) are diagrams showing the relationship between current and light output of a known semiconductor laser and a semiconductor laser according to the present invention, respectively.
Figure 9B:
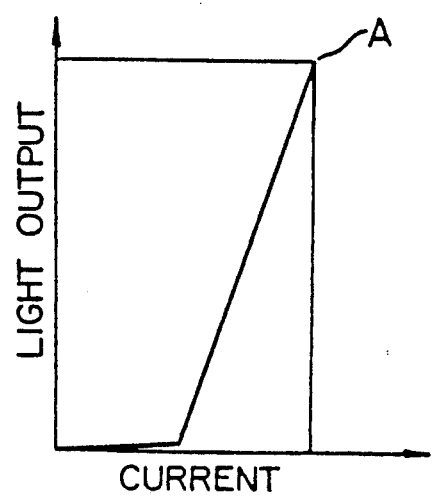
Figure 10:
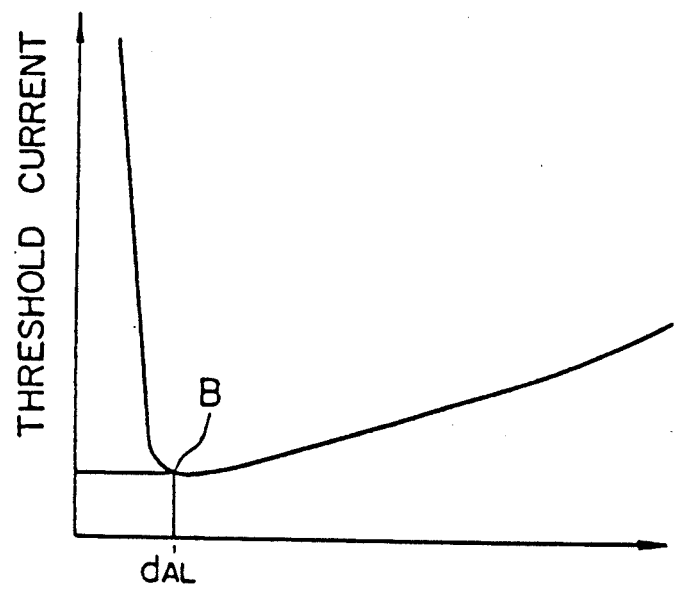
FIG. 10 is a diagram showing the relationship between the active layer thickness and the threshold current density for known semiconductor lasers.

FIG. 9(a) shows the current and light output characteristics for a known semiconductor laser which lacks the current blocking structure at the facets, i.e., lacks a non-injection region. FIG. 9(b) shows the current and light output characteristics of a device according to the invention which has at least one current non-injection region at a facet. As shown in those figures, the COD level of lasers according to the present invention is improved by more than 20 percent compared to the known device.

In the described process for manufacturing the illustrated embodiment of the invention, the active layer 3 is not etched nor exposed to either an etchant or the ambient. Therefore, there is no formation of an interface layer that may refract coherent laser light and disturb the far-field radiation pattern of the laser. Moreover, there is no regrowth interface at the active layer since layers 2, 3, and 4' are all deposited sequentially in a single deposition step. This absence of a regrowth interface further avoids absorption of laser light in the structure and increases the lifetime of the novel laser.

Figures 4A, 4B:
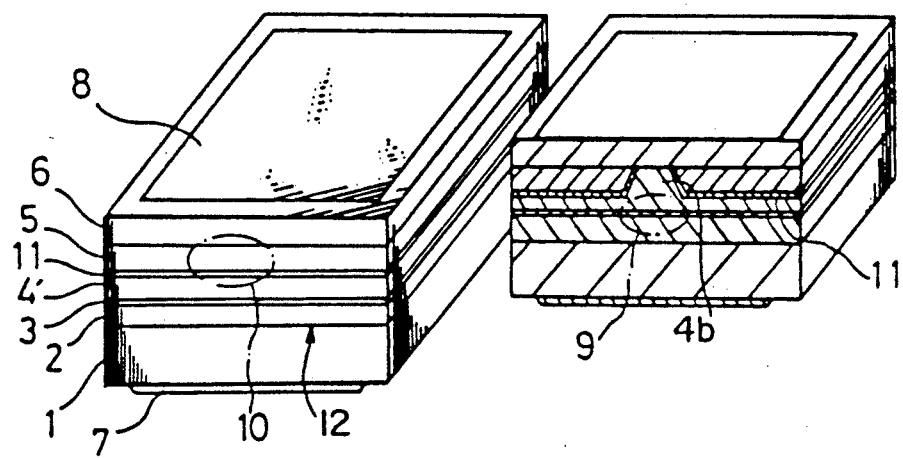
FIGS. 4(a) and 4(b) are a perspective view and a transverse sectional view, respectively, of the structure of another semiconductor laser according to an embodiment of the invention.

FIGS. 4(a) and 4(b) show another embodiment of a laser structure according to the invention. That structure is identical to the one just described with respect to FIGS. 1(a) and 1(b) except that a p-type GaAs buffer layer 11 is disposed between the current blocking layer 5' and the second cladding layer 4'. The buffer layer 11 improves the rectifying characteristics of the pn junction formed by layers 4' and 5' so that the non-injection characteristic at the facets is improved.

In the embodiments of the invention described, the light generated in the laser oscillation region 9 is guided by the first and second cladding layers 2 and 4'. Some broadening of the laser light beam occurs in those cladding layers. The blocking layer 5' is close to the active layer 3 in the region 10 near the facets 12 and 13 so that the broadened portions of the laser light beam are absorbed by the blocking layer 5'. This absorption causes some temperature rise near the facets and limits the improvement that can be attained in the COD level.

Figures 5A, 5B:
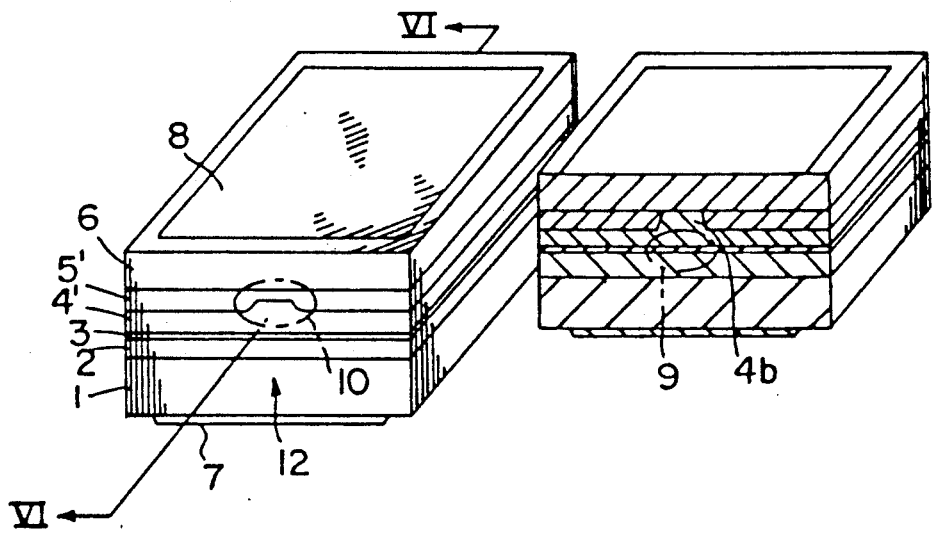
FIGS. 5(a) and 5(b) are a perspective view and a transverse sectional view, respectively, of the structure of a semiconductor laser according to yet another embodiment of the invention.
Figure 6:
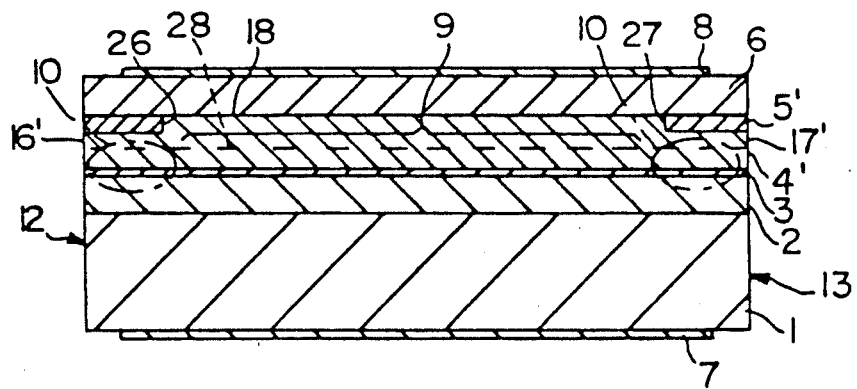
FIG. 6 is a longitudinal cross-sectional view of the semiconductor laser of FIG. 5 taken along line VI—VI of FIG. 5(a).

FIGS. 5(a), 5(b), and 6 show a semiconductor laser device according to another embodiment of the present invention which achieves still larger improvements in the COD level. FIGS. 5(a), 5(b), and 6 are analogous to FIGS. 1(a), 1(b), and 2, respectively. FIG. 5(a) is a perspective view, FIG. 5(b) is a transverse sectional view, and FIG. 6 is a longitudinal view taken along line VI—VI of FIG. 5(a).

Figure 7A:
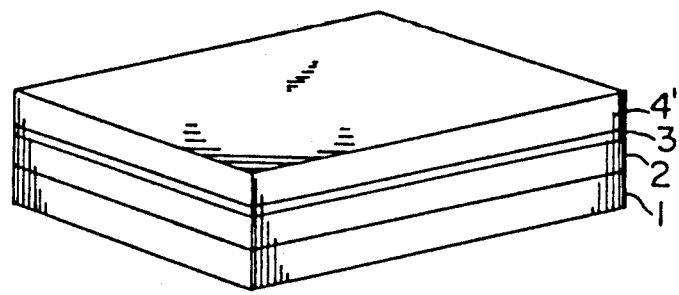
FIGS. 7(a), 7(b), and 7(c) are diagrams illustrating a process for producing the semiconductor laser of FIG. 5(a).
Figure 7B:
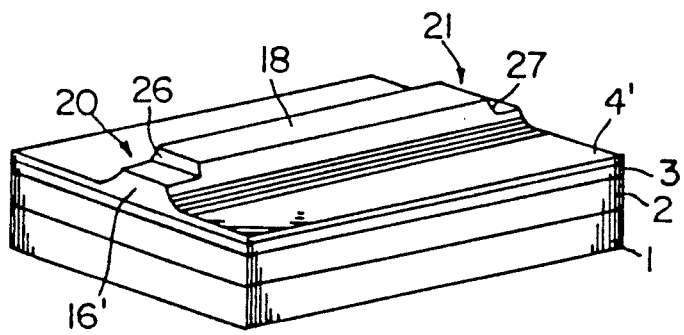
Figure 7C:
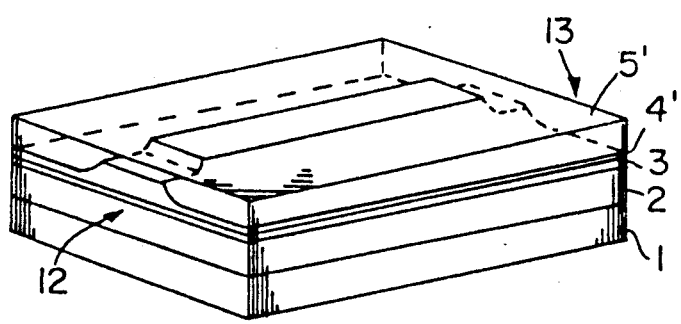
Figure 8:
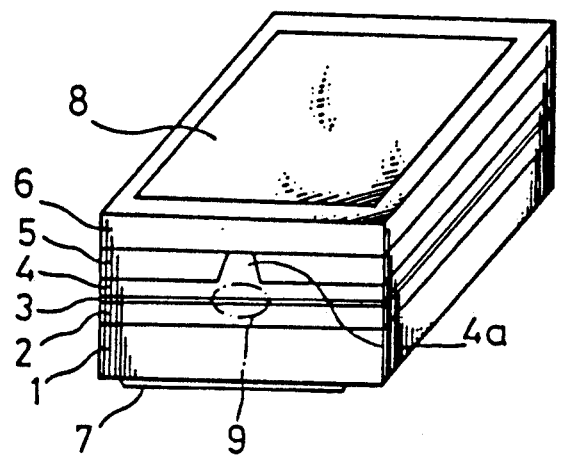
FIG. 8 is a perspective view of the structure of a known semiconductor laser.
Figure 11:
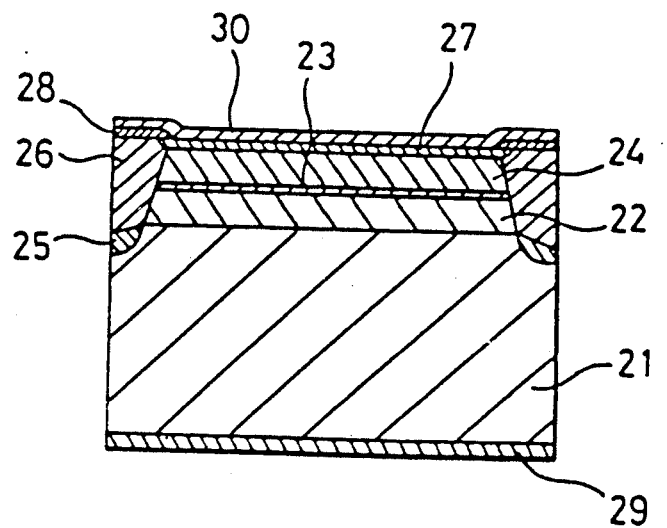
FIG. 11 is a longitudinal cross-sectional view of the structure of a known semiconductor laser.

FIGS. 7(a) to 7(c) are analogous to FIGS. 3(a) to 3(c), respectively, and illustrate a process for making the laser device of FIG. 5(a). Since the laser device of FIG. 1(a) has been described in detail, only the differences between it and the structures of FIGS. 5, 6, and 7 need to be explained.

The principal difference between the laser structure of FIG. 5(a) and that of FIG. 1(a) lies in the extent of the mesa 4b in the direction of the respective facets 12 and 13. In the embodiment described with respect to FIG. 1(a), the ends 16 and 17 of the mesa are generally smooth as a result of etching and are spaced from the respective facets 12 and 13. In the embodiment of the invention shown in FIGS. 5(a) and 6, a portion 16' of the mesa end is part of facet 12. Likewise, a portion 17' of the other end of the mesa is coplanar with facet 13. Other portions 26 and 27 of the ends of the mesa are spaced from the respective facets 12 and 13. This stepped end configuration is best shown in FIGS. 7(b) and 7(c) illustrating a process for making the laser structure.

In contrast to the production step illustrated in FIG. 3(b), in the step shown in FIG. 7(b), mesa 4b is initially formed by etching cladding layer 4' so that mesa 4b extends fully between what is or will become facets 12 and 13. Thereafter, in a second etching step, only the portions of mesa 4b adjacent facets 12 and 13 are exposed and etched. Conventional photolithography techniques can be employed to expose only those mesa portions. As a result of the second etching, steps 20 and 21 are formed in mesa 4b. Those steps leave in place ends 16' and 17' of the mesa that are coplanar with facets 12 and 13 respectively, and end portions 26 and 27 of mesa 4b that are spaced from facets 12 and 13 respectively. Current blocking layer 5' is then deposited as illustrated in FIG. 7(c), burying mesa 4b at its sides 14 and 15. The mesa is only partially buried at its ends, that is, end portions 16' and 17' are not buried by current blocking layer 5' whereas end portions 26 and 27 are buried by current blocking layer 5'.

In FIG. 6, a longitudinal sectional view of the laser structure of FIG. 5(a), it can be seen that the current blocking layer portions 5' adjacent regions 10 are thinner than in the structure shown in FIG. 2. The base of mesa 4a is illustrated in FIG. 6 by broken line 28. In the structure of FIG. 2, the cladding layer portions 5' extend the full distance from contacting layer 6 to the base of mesa 4b. However, in the structure of FIG. 6 cladding layer portions 5' extend only part of the distance from contacting layer 6 to mesa base 28. In other words, in the embodiment of FIG. 5(a), the blocking layer 5' at the region 10 is spaced farther from active layer 3 than in the embodiment of FIG. 1(a). For that reason, absorption of laser light in the blocking layer 5' near the facets is reduced so that, for a particular laser current, the temperature rise of the facet is smaller Thus, the COD level in the laser structure of FIG. 5(a) shows a greater improvement over the prior art than the structure of FIG. 1(a).

While the invention has been described with respect to a preferred embodiment comprising p-type and n-type GaAs and AlGaAs semiconductors, the conductivity types of the layers can be interchanged. It is an important feature of the invention that a rectifying junction be formed between second cladding layer 4' and current blocking layer 5' without regard to which of those layers is p-type and which is n-type. In many commercial lasers, it is preferable to employ a p-type semiconductor layer as the active layer. However, n-type and undoped layers can also be employed as the active layer of the laser structure. Other indirect band gap semiconductor materials besides GaAs and AlGaAs can also be employed in laser structures according to the invention.

We claim:

1. A method of making a semiconductor laser comprising:

successively depositing on a semiconductor substrate of a first conductivity type a first cladding semiconductor layer of the first conductivity type, an active semiconductor layer, and a second cladding semiconductor layer of a second conductivity type;

removing a portion of the second cladding layer to form a forward mesa in said cladding layer projecting away from the substrate and having a top surface opposite the substrate, lateral sides, and transverse ends;

depositing a current blocking semiconductor layer of the first conductivity type on the second cladding layer to bury the sides and to bury the ends of the mesa at least partially;

depositing a contacting semiconductor layer of the second conductivity type on the current blocking layer and on the top surface of the mesa, at least one of the ends being spaced from the adjacent facet;

forming first and second opposed facets at least partially spaced from the end surfaces of the mesa; and depositing electrodes on the substrate and contacting layer.

2. The method of claim 1 including removing a portion of the second cladding layer without exposing the active layer.

3. The method of claim 1 including depositing the first cladding layer, the active layer, and the second cladding layer by a metal organic chemical vapor deposition process.

4. The method of claim 1 including depositing GaAs as the current blocking and contacting layers and depositing AlGaAs as the first and second cladding layers and the active layer.

5. The method of claim 1 including depositing a buffer layer of the second conductivity type between the second cladding layer and the current blocking layer.

6. The method of claim 1 including forming the first and second facets by cleaving.

7. The method of claim 1 including forming the mesa with generally smooth transverse ends, burying the ends with the current blocking layer, and forming first and second facets spaced from at least one of the transverse ends.

8. The method of claim 1 including forming the mesa with at least a first transverse end having a stepped portion, burying the stepped portion with the current blocking layer, and forming the first facet at the first transverse end with the stepped portion of the mesa spaced from the first facet.

9. The method of claim 8 including forming the mesa with a stepped portion at the second transverse end, burying the stepped portion at the second transverse end with the current blocking layer, and forming the second facet at the second transverse end with the stepped portion of the mesa spaced from the second facet.

* * * * *